(12) United States Patent
Kang (10) Patent No.: US 7,583,524 B2
(45) Date of Patent: Sep. 1, 2009

(54) NONVOLATILE SEMICONDUCTOR MEMORY DEVICE

(75) Inventor: Hee Bok Kang, Cheongju-si (KR)

(73) Assignee: Hynix Semicodnuctor Inc., Icheon-si (KR)

( * ) Notice: Subject to any disclaimer, the term of this patent is extended or adjusted under 35 U.S.C. 154(b) by 127 days.

(21) Appl. No.: 11/646,287

(22) Filed: Dec. 28, 2006

(65) Prior Publication Data

US 2007/0153602 A1    Jul. 5, 2007

(30) Foreign Application Priority Data

Dec. 30, 2005    (KR) ............ 10-2005-0135238

(51) Int. Cl.
*G11C 5/06*    (2006.01)

(52) U.S. Cl. ............ 365/63; 365/230.06; 365/230.03; 365/231; 365/189.08

(58) Field of Classification Search ............ 365/230.03, 365/230.01, 231, 189.08, 63
See application file for complete search history.

(56) References Cited

U.S. PATENT DOCUMENTS

| | | | | |
|---|---|---|---|---|
| 3,982,111 | A * | 9/1976 | Lerner et al. ............ | 714/718 |
| 5,089,862 | A * | 2/1992 | Warner et al. ............ | 326/44 |
| 5,280,447 | A * | 1/1994 | Hazen et al. ............ | 365/185.11 |
| 5,559,749 | A * | 9/1996 | McLaury ............ | 365/230.02 |
| 5,835,396 | A * | 11/1998 | Zhang ............ | 365/51 |
| 6,504,742 | B1 * | 1/2003 | Tran et al. ............ | 365/51 |
| 6,567,301 | B2 * | 5/2003 | Anthony et al. ............ | 365/175 |
| 6,741,513 | B2 | 5/2004 | Hönigschmid et al. | |
| 6,768,685 | B1 * | 7/2004 | Scheuerlein ............ | 365/189.07 |
| 6,822,903 | B2 * | 11/2004 | Scheuerlein et al. ... | 365/185.18 |
| 6,856,572 | B2 * | 2/2005 | Scheuerlein et al. ... | 365/230.06 |
| 6,859,410 | B2 * | 2/2005 | Scheuerlein et al. ... | 365/230.06 |
| 6,879,516 | B2 * | 4/2005 | Nejad et al. ............ | 365/171 |
| 6,882,553 | B2 * | 4/2005 | Nejad et al. ............ | 365/63 |
| 7,022,572 | B2 * | 4/2006 | Scheuerlein et al. ........ | 438/257 |
| 7,190,602 | B2 * | 3/2007 | Johnson et al. ............ | 365/63 |
| 7,251,157 | B2 | 7/2007 | Osada et al. | |
| 7,266,006 | B2 | 9/2007 | Kang | |
| 7,272,052 | B2 * | 9/2007 | Scheuerlein et al. ... | 365/185.23 |
| 7,286,439 | B2 * | 10/2007 | Fasoli et al. ............ | 365/230.06 |
| 7,291,878 | B2 * | 11/2007 | Stipe ............ | 257/296 |
| 7,307,268 | B2 * | 12/2007 | Scheuerlein ............ | 257/2 |

FOREIGN PATENT DOCUMENTS

KR    10-2005-0110680 A    11/2005

* cited by examiner

*Primary Examiner*—Viet Q Nguyen
(74) *Attorney, Agent, or Firm*—Finnegan, Henderson, Farabow, Garrett & Dunner, L.L.P.

(57) ABSTRACT

A nonvolatile semiconductor memory device includes a plurality of 3-dimensional cell arrays to reduce the chip size. The nonvolatile semiconductor memory device includes a unit block cell array including a plurality of vertically multi-layered cell arrays each including a plurality of unit cells arranged in row and column directions, a column address decoder configured to decode a column address to activate a bit line of the selected cell array from the plurality of cell arrays, a sense amplifier unit configured to sense and amplify data of the bit line of the plurality of cell arrays and shared by the unit block cell array, and a vertical address decoding unit configured to decode a vertical address to select one of the plurality of cell arrays and to connect an output signal from the sense amplifier to the bit line of the selected cell array.

19 Claims, 7 Drawing Sheets

NONVOLATILE SEMICONDUCTOR MEMORY DEVICE

RELATED APPLICATION

The present application claims the benefit of priority to Korean patent application number 10-2005-0135238, filed on Dec. 30, 2005, which is incorporated herein by reference in its entirety.

BACKGROUND

1. Technical Field

The present invention generally relates to nonvolatile semiconductor memory device, and more specifically, to a semiconductor memory device comprising a three-dimensional cell array and a sense amplifier unit shared by a plurality of vertically deposited unit block cell arrays to reduce chip size.

2. Description of the Related Art

Ferroelectric Random Access Memory (FeRAM) device has attracted considerable attention as the next generation memory device because it has a data processing speed as fast as a Dynamic Random Access Memory (DRAM) and conserves data even after the power is turned off.

An FeRAM having a structure similar to that of a DRAM includes capacitors made of a ferroelectric substance, which has a high residual polarization, allowing for data retention after power is turned off.

A unit cell of a conventional nonvolatile FeRAM device includes a switching element and a nonvolatile ferroelectric capacitor. The switching element performs a switching operation depending on a state of a word line to connect a nonvolatile ferroelectric capacitor to a sub bit line. The nonvolatile ferroelectric capacitor is connected between a plate line and one terminal of the switching element. Here, the switching element of the conventional FeRAM is a NMOS transistor whose switching operation is controlled by a gate control signal.

In the conventional FeRAM, as the cell size becomes smaller, data retention characteristics are degraded so that a normal operation of cells is difficult to perform. For example, when a voltage is applied to an adjacent cell in a read mode of a cell, an interface noise generated between the cells results in the destruction of data. Also, when a write voltage is applied to an unselected cell in a write mode of a cell, data of the unselected cells are destroyed, hindering random access operation.

For Metal Ferroelectric Insulator Silicon (MFIS) and Metal Ferroelectric Metal Insulator Silicon (MFMIS), the data retention characteristics are degraded by depolarization charges. The degradation of data retention characteristics caused by smaller cell size is also a problem for other well-known nonvolatile memory devices such as a phase-change RAM (PRAM) device, a magnetoresistive RAM (MRAM) device, or a resistive RAM (ReRAM) device.

SUMMARY

Embodiments of the present invention provide a nonvolatile semiconductor memory device including a plurality of vertically deposited unit block cell arrays which are arranged in row and column directions and a sense amplifier unit shared by the plurality of unit block cell arrays, thereby reducing a chip size, where a vertical (Z) address decoder selects one of the plurality of unit block cell arrays.

Consistent with an embodiment of the present invention, a nonvolatile semiconductor memory device comprises a unit block cell array including a plurality of vertically multi-layered cell arrays each including a plurality of unit cells arranged in row and column directions, a column address decoder configured to decode a column address to activate a bit line of the selected cell array from the plurality of cell arrays, a sense amplifier unit configured to sense and amplify data of the bit line of the plurality of cell arrays and shared by the unit block cell array, and a vertical address decoding unit configured to decode a vertical address to select one of the plurality of cell arrays and to connect an output signal from the sense amplifier to the bit line of the selected cell array.

DETAILED DESCRIPTION

Embodiments consistent with the present invention will be described in detail with reference to the accompanying drawings.

Figure 1:
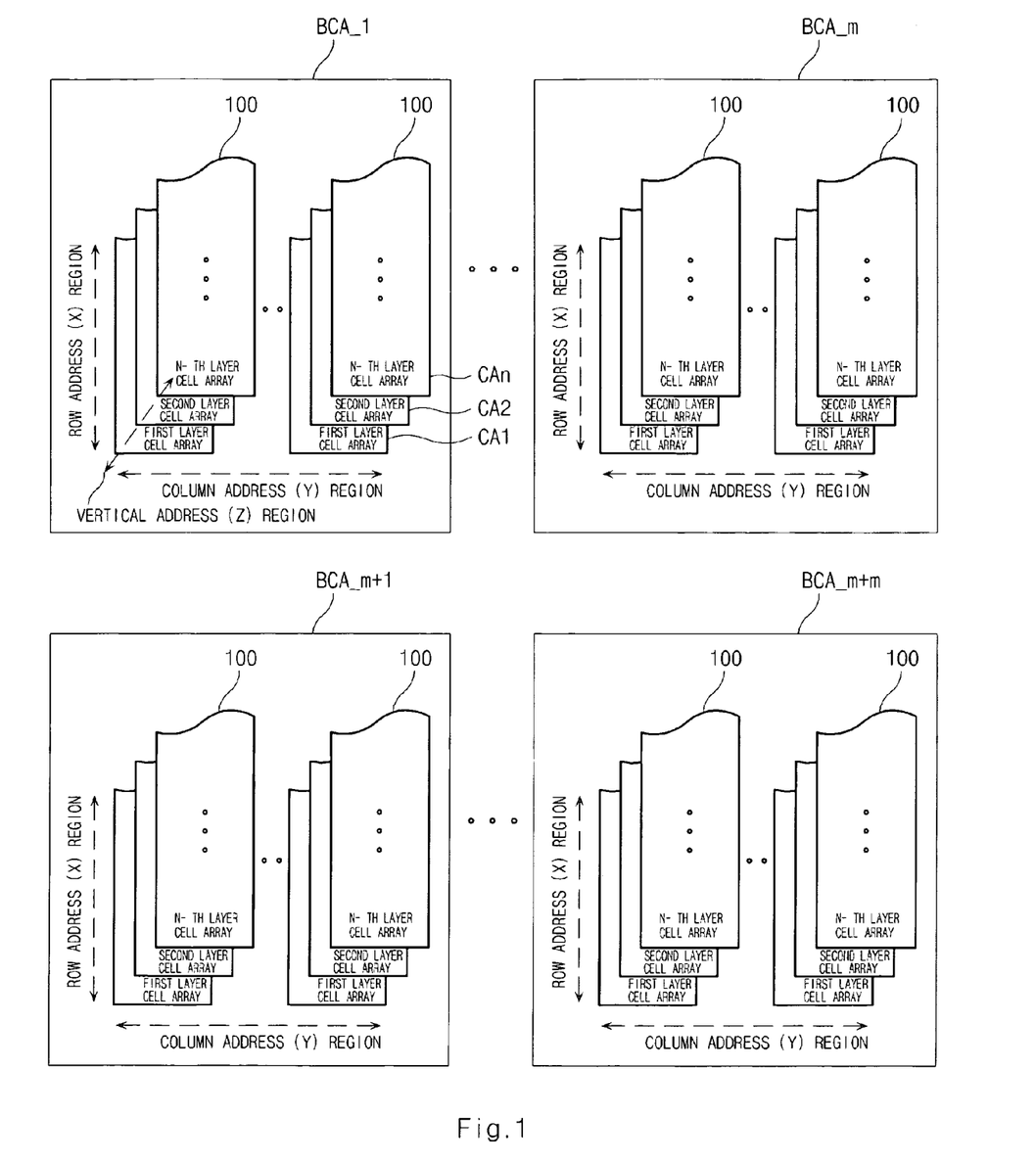
FIG. 1 is a diagram illustrating a plurality of bank cell arrays of a nonvolatile semiconductor memory device consistent with an embodiment of the present invention.

FIG. 1 is a diagram illustrating a plurality of bank cell arrays (BCA_1~BCA_m+m) of a nonvolatile semiconductor memory device consistent with an embodiment of the present invention.

A cell array CA1 has a 2-dimensional plane structure including a plurality of row address (X) regions arranged in a row direction (axis X) and a plurality of column address (Y) regions arranged in a column direction (axis Y).

A unit block cell array 100, which has a 3-dimensional structure including a plurality of cell arrays CA1~CAn deposited in a vertical direction (axis Z), selects one of cell arrays CA1~CAn by a vertical address Z.

A row address X selects a word line, and a column address Y selects a bit line in one cell array CA1. The vertical address Z selects one of cell arrays CA1~CAn.

Unit block cell array 100 includes the plurality of cell arrays CA1~CAn which are deposited in the vertical direction (axis Z). A unit bank cell array BCA includes a plurality of unit block cell arrays 100.

In this embodiment, the plurality of cell arrays CA1~CAn are described as including one unit block cell array 100, and the plurality of unit block cell arrays 100 are described as including one unit bank cell array BCA. However, in other embodiments, one unit bank cell array BCA may include a plurality of cell arrays CA1~CAn formed vertically in the same layer, and a plurality of unit bank cell arrays BCA may be deposited vertically.

A plurality of unit bank cell arrays BCA, which are arranged in row and column directions, are configured to perform read/write operations individually to improve the operation speed of the cell.

Although a plurality of unit bank cell arrays BCA are arranged in row and column directions in this embodiment, a plurality of unit bank cell arrays BCA may be arranged in directions X, Y and Z based on the deposition direction of the plurality of cell arrays CA1~CAn. One unit bank cell array BCA, which includes unit block cell arrays 100 in a given group, is configured to perform read/write operations independently.

Figure 2:
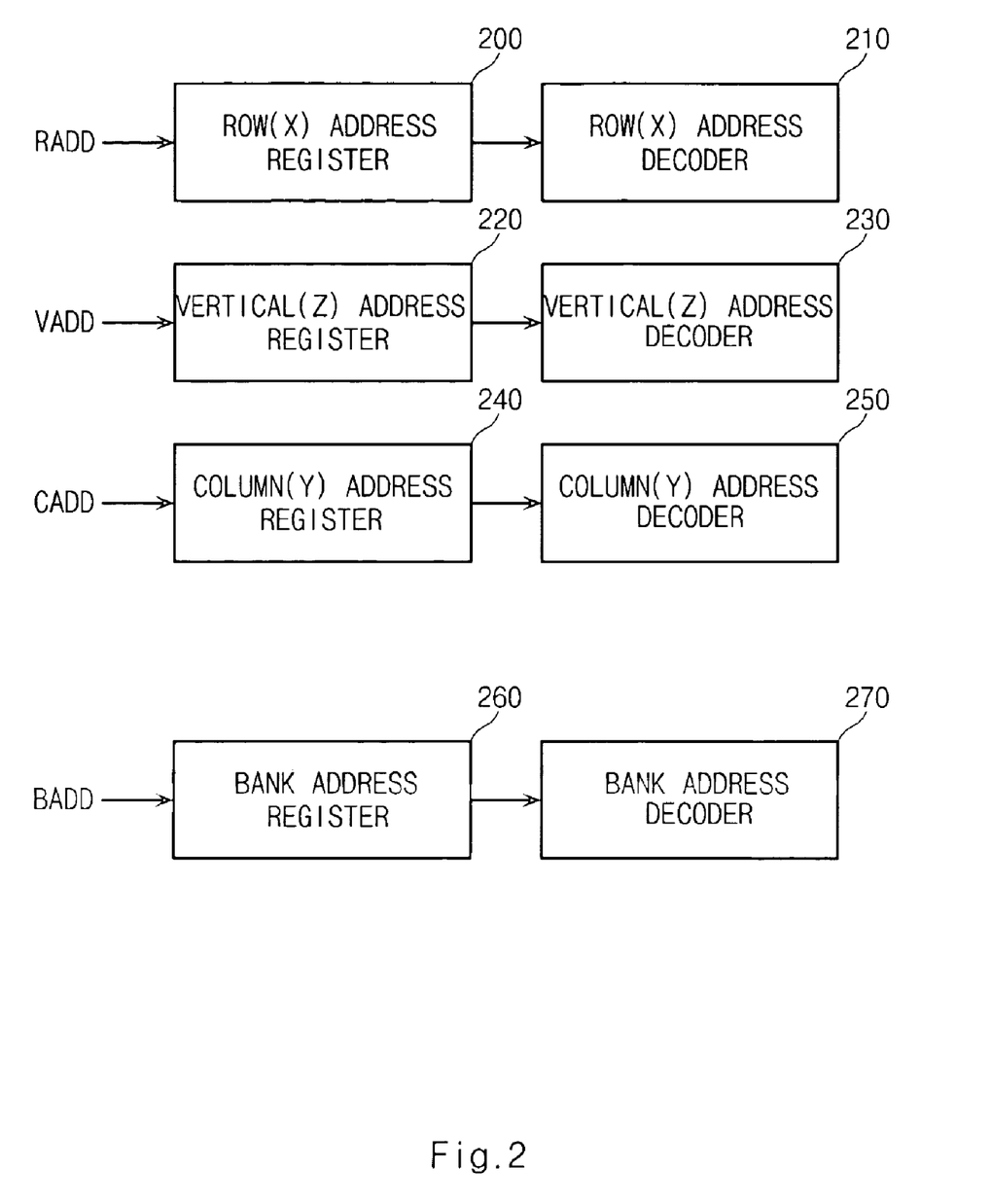
FIG. 2 is a diagram illustrating an address decoding unit of a nonvolatile semiconductor memory device consistent with an embodiment of the present invention.

FIG. 2 is a diagram illustrating an address decoding unit of a nonvolatile semiconductor memory device consistent with an embodiment of the present invention.

The address decoding unit includes a row (X) address register 200, a row address decoder 210, a vertical (Z) address register 220, a vertical address decoder 230, a column (Y) address register 240, a column address decoder 250, a bank address register 260, and a bank address decoder 270.

Row address register 200 stores a row address RADD. Row address decoder 210 decodes an output signal from row address register 200. Vertical address register 220 stores a vertical address VADD. Vertical address decoder 230 decodes an output signal from vertical address register 220.

Column address register 240 stores a column address CADD. Column address decoder 250 decodes an output signal from column address register 240. Bank address register 260 stores a bank address BADD. Bank address decoder 270 decodes an output signal from bank address register 260.

Row address register 200, vertical address register 220, and column address register 240 process row address RADD, vertical address VADD, and column address CADD which are inputted from separate pads. Bank address register 260 processes bank address BADD inputted from the pad which is separated from pads where row address RADD, vertical address VADD, and column address CADD are inputted.

Figure 3:
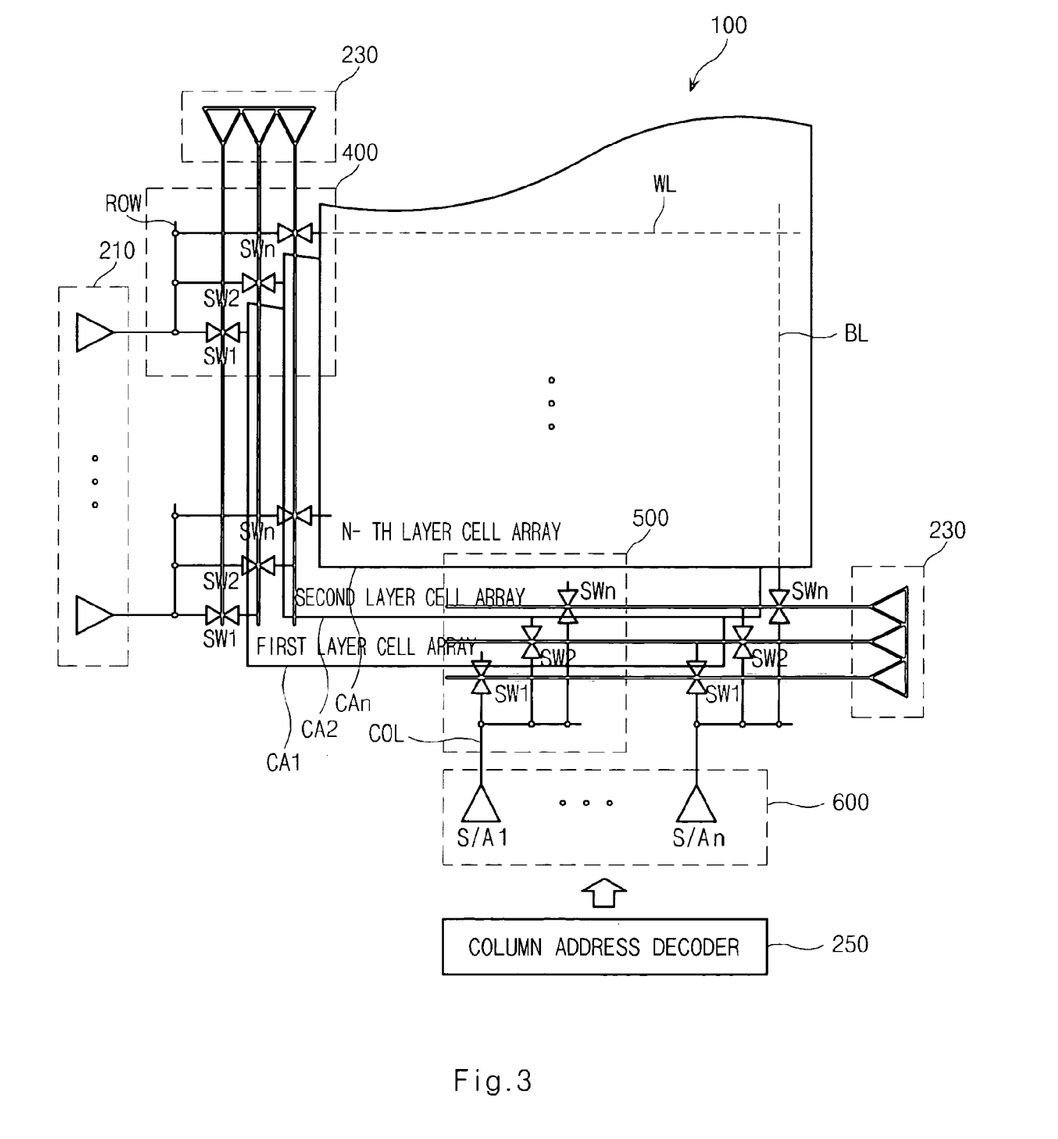
FIG. 3 is a diagram illustrating an address decoding unit and a sense amplifier unit of a nonvolatile semiconductor memory device consistent with an embodiment of the present invention.

FIG. 3 is a diagram illustrating an address decoding unit and a sense amplifier unit of a nonvolatile semiconductor memory device consistent with an embodiment of the present invention.

In an embodiment consistent with the present invention, the address decoding unit related to the row address includes a vertical address decoder 230, a row address decoder 210, and a row decoding unit 400. Row decoding unit 400 includes a plurality of switches SW1~SWn corresponding one-to-one with word lines WL in a plurality of cell arrays CA1~CAn.

Vertical address decoder 230 is configured to select one of cell arrays CA1~CAn which are deposited vertically in one unit block cell array 100. Row address decoder 210 is configured to select one of word lines WL in one cell array CAn selected by vertical address decoder 230.

Switches SW1~SWn of row decoding unit 400 are configured to selectively connect a row line ROW selected by an output signal from row address decoder 210 to a word line WL of the selected cell array CAn depending on output states of vertical address decoder 230.

Meanwhile, the address decoding unit related to the column address includes vertical address decoder 230, column address decoder 250, a sense amplifier decoding unit 500, and a sense amplifier unit 600. Sense amplifier decoding unit 500 includes a plurality of switches SW1~SWn corresponding one-to-one with bit lines BL in cell arrays CA1~CAn.

Vertical address decoder 230 is configured to select one of cell arrays CA1~CAn which are deposited vertically in unit block cell array 100. Column address decoder 250 is configured to select one of bit lines BL in cell array CAn selected by vertical address decoder 230.

Sense amplifier unit 600 includes a plurality of sense amplifiers S/A1~S/An each configured to sense and amplify data of a plurality of bit lines BL in the plurality of cell arrays CA1~CAn. Sense amplifier unit 600 is configured to connect one bit line BL to one sense amplifier S/An selected by a decoding result of column address decoder 250.

The plurality of cell arrays CA1~CAn which are deposited vertically in unit block cell array 100 share one sense amplifier unit 600. The plurality of switches SW1~SWn of sense amplifier decoding unit 500 are connected one-to-one with bit lines BL of each cell array CA1~CAn.

Suppose that one of the plurality of sense amplifiers S/A1~S/An is selected by a decoding result of column address decoder 250. The plurality of switches SW1~SWn of sense amplifier decoding unit 500 are configured to selectively connect a column line COL of the selected sense amplifier S/An to one bit line BL of selected cell array CAn in response to an output signal from vertical address decoder 230.

Thus, read/write operations are performed on a unit cell C in a region where word line WL selected by row decoding unit 400 is crossed with bit line BL selected by sense amplifier decoding unit 500.

Figure 4:
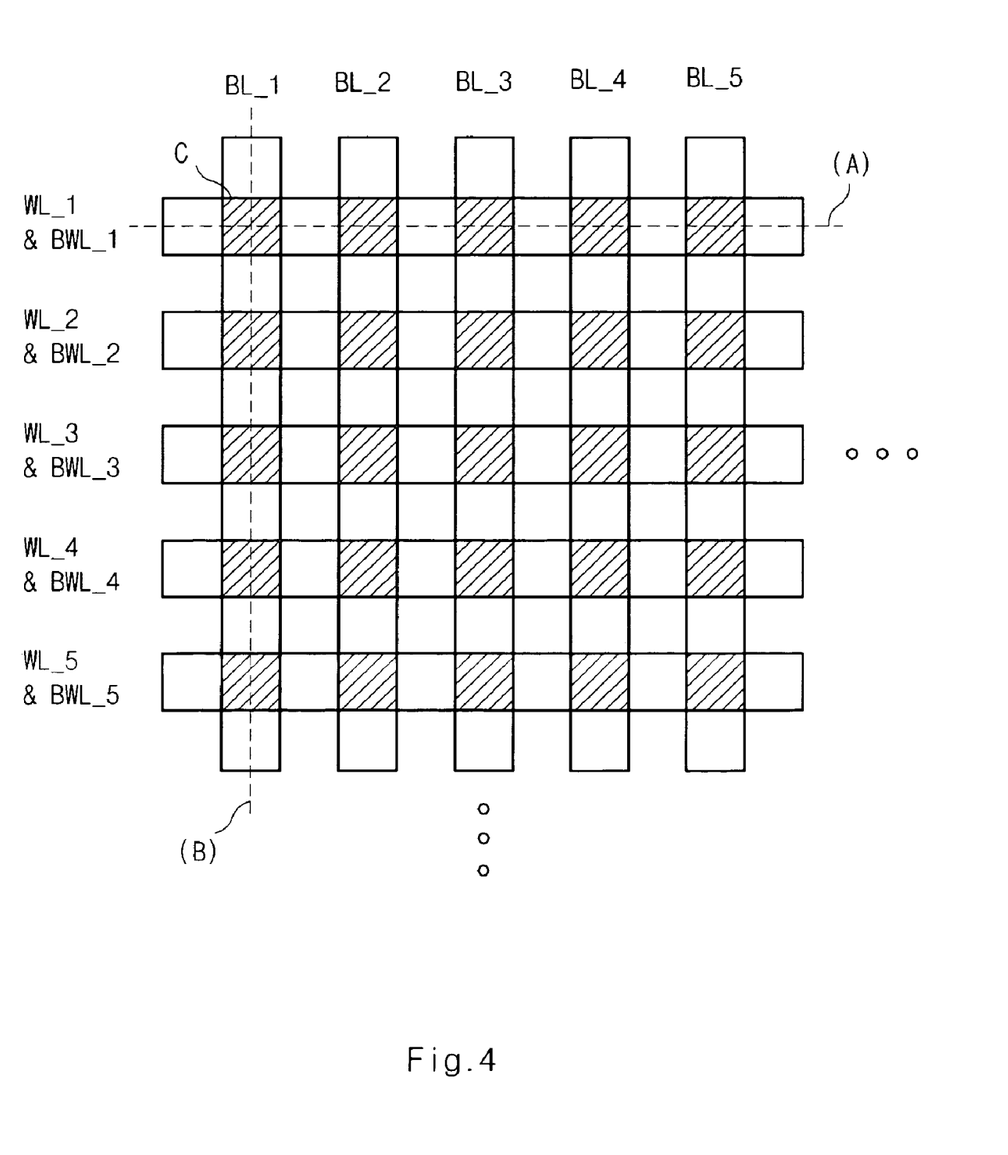
FIG. 4 is a diagram illustrating a cell array of FIG. 1.

FIG. 4 is a layout cross-sectional diagram illustrating the n-th layer cell array CAn consistent with an embodiment of the present invention.

A plurality of word lines WL are arranged in parallel with a plurality of bottom word lines BWL in a column direction. A plurality of bit line BL are arranged perpendicular to a plurality of word lines WL. A plurality of unit cells C are located in a region where the plurality of word lines WL, the plurality of bottom word lines BWL, and the plurality of bit lines BL cross.

Figure 5:
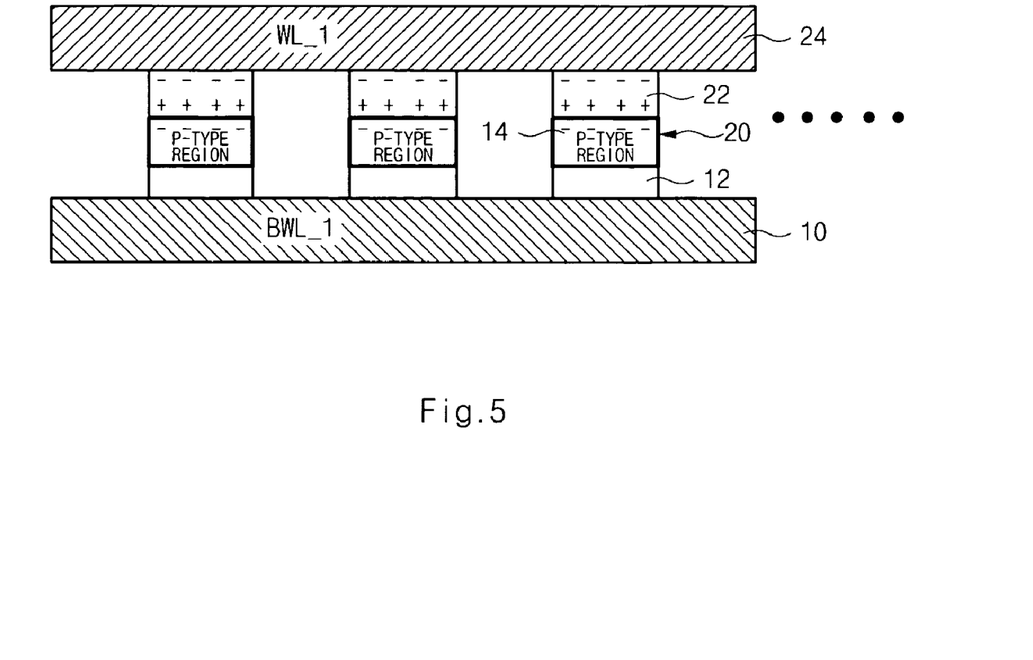
FIGS. 5 and 6 are cross-sectional diagrams illustrating the cell array of FIG. 1.

FIG. 5 is a cross-sectional diagram illustrating the n-th layer cell array CAn of FIG. 4 in parallel with word line WL in direction A.

The n-th layer cell array CAn includes a plurality of insulating layers 12 over bottom word lines 10 and a plurality of P-type channel regions 14 over the plurality of insulating layers 12. A plurality of ferroelectric layers 22 are formed over the plurality of P-type channel regions 14. A plurality of word lines 24 are formed in parallel with bottom word lines 10 over the plurality of ferroelectric layers 22. As a result, a plurality of cells are connected between one word line WL_1 and one bottom word line BWL_1.

Figure 6:
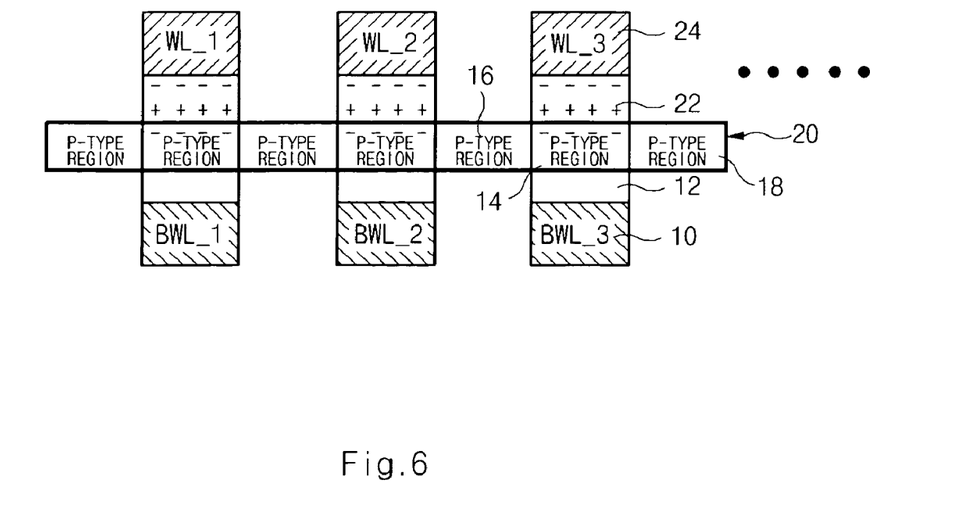

FIG. 6 is a cross-sectional diagram illustrating the n-th layer cell array CAn in direction perpendicular to word line WL as shown in FIG. 5.

In the n-th layer cell array CAn, insulating layers 12 are formed over bottom word lines BWL_1, BWL_2, and BWL_3. A floating channel layer 20 including a P-type drain region 16, a P-type channel region 14, and a P-type source region 18, which are connected serially, is formed over insulating layer 12.

P-type drain region 16 may be used as a source region in the adjacent cell, and P-type source region 18 may be used as a drain region in the adjacent cell. That is, P-type regions are commonly used as a drain region and a source region in adjacent cells.

Drain region 16, source region 18, and channel region 14 of floating channel layer 20 are formed as a P-type region. A semiconductor of floating channel layer 20 is selected from the group consisting of a carbon nano-tube, a silicon, a germanium, and an organic semiconductor.

Ferroelectric layer 22 is formed over each channel region 14 of floating channel layer 20, and word lines WL_1, WL_2, and WL_3 are formed over ferroelectric layer 22. Bottom word line 10 and word line 24 are selectively driven by the same row address decoder (not shown).

Data is read/written using a channel resistance of floating channel layer 20 which is differentiated depending on a polarization state of ferroelectric layer 22. That is, when the polarity of ferroelectric layer 22 induces positive (+) charges to channel region 14, the memory cell is at a high resistance state so that a channel is turned "off". When the polarity of ferroelectric layer 22 induces negative (−) charges t channel region 14, the memory cell is at a low resistance state so that a channel is turned "on".

Figure 7:
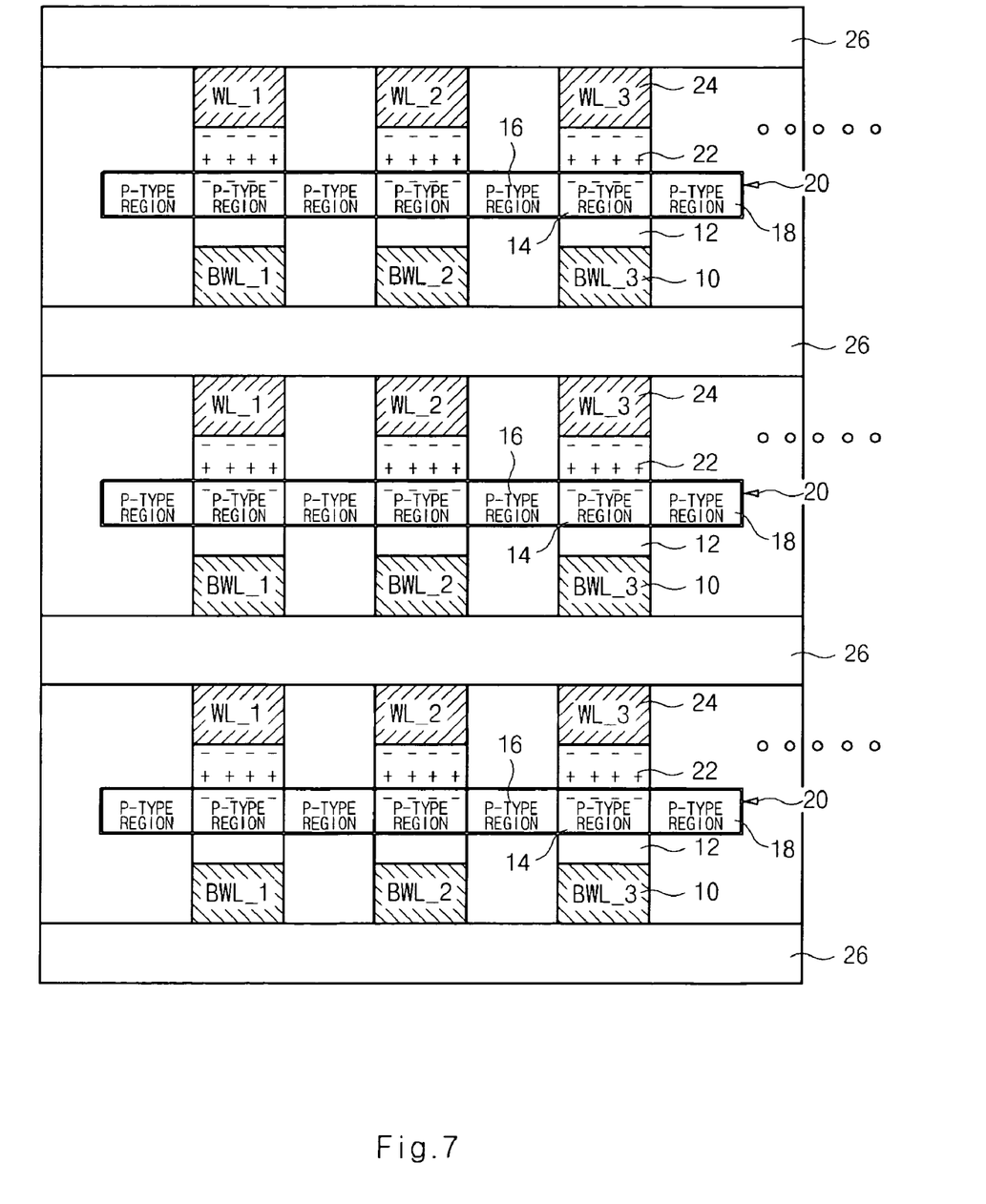
FIG. 7 is a cross-sectional diagram illustrating a unit block cell array of FIG. 1.

FIG. 7 is a cross-sectional diagram illustrating unit block cell array 100.

The unit block cell array 100 includes a plurality of multi-layered unit cell arrays CA1~CAn, as shown in FIG. 6, which are separated by cell insulating layers 26.

Figure 8:
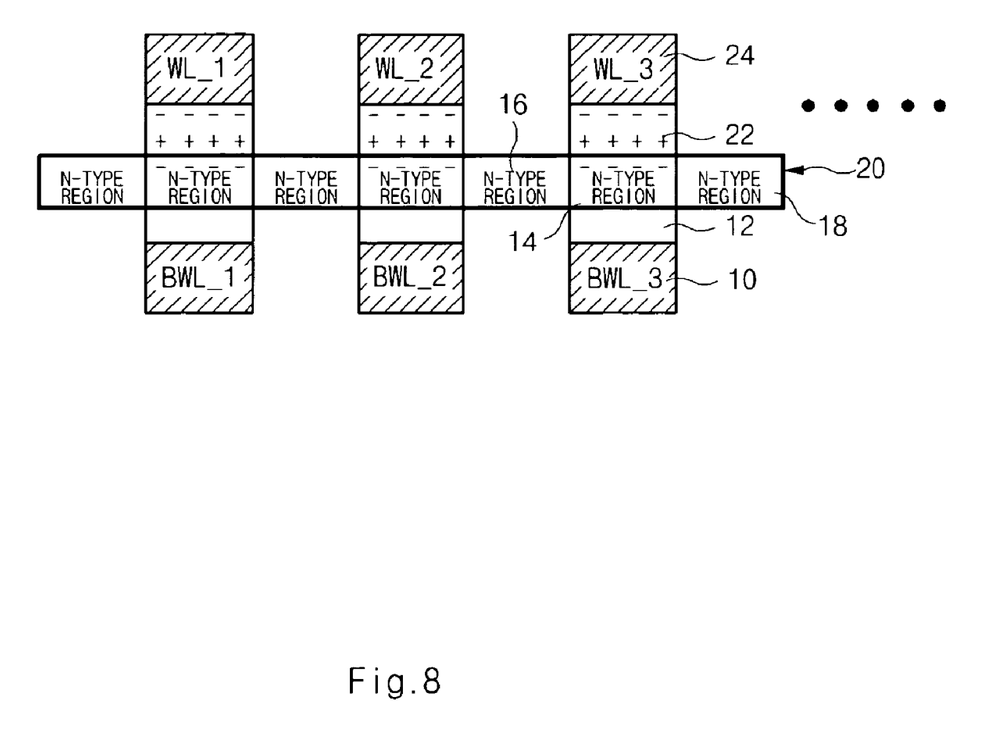
FIG. 8 is a diagram illustrating a cell array of FIG. 1.

Although floating channel layer 20 includes P-type drain region 16, P-type channel region 14, and P-type source region 18 in this embodiment of the present invention, floating channel layer 20 may include an N-type drain region, an N-type channel region, and an N-type source region as shown in FIG. 8.

One unit bank cell array BCA_1 of bank cell arrays BCA is selected by an output signal from bank address decoder 270. Row address RADD is decoded by a combination of output signals from vertical address decoder 230 and row address decoder 210.

When the corresponding switch SWn of row decoding unit 400 is turned on in response to an output signal from vertical address decoder 230 in the selected unit bank cell array BCA_1, the n-th layer cell array CAn is selected. When the switch SWn is turned on, one word line WL selected by row address decoder 210 is activated in the selected n-th layer cell array CAn.

Column address CADD is decoded by combination of output signals from vertical address decoder 230, column address decoder 250, and sense amplifier unit 600.

One sense amplifier S/An of sense amplifiers S/A~S/An is selected by a decoding result of column address decoder 250. When the corresponding switch SWn of sense amplifier decoding unit 500 is turned on in response to the output signal of vertical address decoder 230 in the selected unit bank cell array BCA_1, the n-th layer cell array CAn is selected. When switch SWn is turned on, one sense amplifier S/An selected in the n-th layer cell array CAn is connected to one bit line BL connected to the corresponding switch SWn.

Thus, read/write operations are performed on unit cell C in a region where word line WL selected by row decoding unit 400 is crossed with the bit line selected by sense amplifier decoding unit 500.

Consistent with an embodiment of the present invention, the read/write operations of high bit data of a nonvolatile semiconductor memory device are explained below.

When high bit data "1" is written, a ground voltage <GND> is applied to bottom word line 10, and a negative voltage <−V> is applied to word line 24. Drain region 16 and source region 18 are configured to be at a ground voltage <GND> state.

A voltage is applied between ferroelectric layer 22 and P-type channel region 14 of floating channel layer 20 by voltage distribution of a capacitor between ferroelectric layer 22 and insulating layer 12. As a result, positive charges are induced to channel region 14 depending on the polarity of ferroelectric layer 22 so that the memory cell is at a low resistance state. Thus, high bit data "1" is written in all cells of the memory in a write mode.

When high bit data "1" is read, ground voltage <GND> or a read voltage <+Vrd> having a positive value is applied to bottom word line 10. Ground voltage <GND> is applied to word line 24. A depletion layer is formed in the bottom of channel region 14 by read voltage <+Vrd> applied from bottom word line 10.

A depletion is not formed in the top of channel region 14 because positive charges are induced to the top of channel region 14. Thus, channel region 14 is turned on to flow current from source region 18 to drain region 16. As a result, high bit data "1" stored in the memory cell is read in a read mode. Even when a slight voltage difference is generated in drain region 16 and source region 18, channel region 14 is turned on so that a large amount of current flows.

Consistent with an embodiment of the present invention, the read/write operations of low bit data of a nonvolatile semiconductor memory device are explained below.

When low bit data "0" is written, a negative voltage <−V> having a negative value is applied to bottom word line 10, and a ground voltage <GND> is applied to word line 24. Negative voltage <−V> is applied to drain region 16 and source region 18.

A high voltage is formed between a positive voltage <+V> applied from word line 24 and negative voltage <−V> of channel region 14. As a result, negative charges are induced to channel region 14 depending on the polarity of ferroelectric layer 22 so that the memory cell is at a high resistance state. Thus, low bit data "0" is written in the memory cell in a write mode.

When low bit data "0" is read, the ground voltage <GND> or a read voltage <+Vrd> having a positive value is applied to bottom word line 10. Ground voltage <GND> is applied to word line 24.

A depletion layer is formed in the bottom of channel region 14 by read voltage <+Vrd> applied from bottom word line 10. Negative charges are induced to the top of channel region 14 so that a depletion layer is formed in the top of channel region 14. A channel of channel region 14 is turned off by the depletion layers formed in channel region 14 so that a current path is disconnected from source region 18 to drain region 16.

Even when a slight voltage difference is generated between drain region 16 and source region 18, channel region 14 is turned off so that a small amount of current flows. Thus, low bit data "0" stored in the memory cell is read in a read mode.

The data retention characteristics of the cell are improved because word line 24 and bottom word line 10 are both kept at a ground level in the read mode so as to not apply a voltage stress to the ferroelectric layer 22.

As described above, in a nonvolatile ferroelectric memory device consistent with an embodiment of the present invention, a Non-Destructive Read-Out (NDRO) system prevents cell data from being destroyed in a read mode. The nonvolatile ferroelectric memory device consistent with the present invention improves the reliability of cells and the read operation speed in a low voltage operation of a nano-scaled ferroelectric cell. A plurality of ferroelectric unit cell arrays are arranged in row and column directions. Also, the plurality of ferroelectric unit cell arrays are deposited vertically to improve integration capacity of cells, thereby reducing the whole size of the chip. A vertical (Z) address decoder selects one of the vertically deposited unit block cell arrays that share one sense amplifier unit to drive cell arrays effectively, thereby improving the operation speed of cells.

The foregoing description of various embodiments of the invention has been presented for purposes of illustrating and description. It is not intended to be exhaustive or to limit the invention to the precise form disclosed, and modifications and variations are possible in light of the above teachings or may be acquired from practice of the invention. Thus, the embodiments were chosen and described in order to explain the principles of the invention and its practical application to enable one skilled in the art to utilize the invention in various embodiments and with various modifications as are suited to the particular use contemplated. For example, a person of ordinary skill in the art may select one of well-known nonvolatile memory cells, such as a PRAM cell, a MRAM cell, a ReRAM cell, and so forth, instead of the FeRAM cell described in the embodiments.

What is claimed is:

1. A nonvolatile semiconductor memory device comprising:
   a unit block cell array including a plurality of vertically layered cell arrays including a plurality of unit cells arranged in row and column directions;
   a column address decoder configured to decode a column address to activate a bit line of a cell array selected from the plurality of cell arrays;
   a sense amplifier unit configured to sense and amplify data of the bit line of the plurality of cell arrays and shared by the unit block cell array; and
   a vertical address decoding unit configured to decode a vertical address to select one of the plurality of cell arrays and to connect an output signal from the sense amplifier to the bit line of the selected cell array;
   wherein the plurality of cell arrays comprise:
      a plurality of bottom word lines;
      an insulating layer formed over the plurality of bottom word lines;
      a floating channel layer formed over the insulating layer and including a plurality of drain and source regions serially connected to a plurality of channel regions alternately;
      a ferroelectric layer formed over the floating channel layer; and
      a plurality of word lines formed over the ferroelectric layer so as to be connected to the plurality of bottom word lines,
      wherein a different resistance is induced to a channel region of the floating channel layer depending on a polarity state of the ferroelectric layer so that data is read or written.

2. The nonvolatile semiconductor memory device according to claim 1, wherein a plurality of unit bank cell arrays comprising a plurality of unit block cell arrays arranged in directions X, Y, and Z based on a deposition direction of the plurality of cell arrays are configured to perform read/write operations individually.

3. The nonvolatile semiconductor memory device according to claim 1, further comprising:
   a row address decoder configured to decode a row address to activate a word line of the selected cell array; and
   a row decoding unit configured to selectively connect a word line of the selected cell array to a row line which is output from the row address decoder in response to an output signal from the vertical address decoding unit.

4. The nonvolatile semiconductor memory device according to claim 3, wherein the row address decoder further comprises a row address register configured to output the row address to the row address decoder.

5. The nonvolatile semiconductor memory device according to claim 3, wherein the row address, the column address, and the vertical address are inputted from separate pads.

6. The nonvolatile semiconductor memory device according to claim 1, further comprising:
   a column address register configured to output the column address to the column address decoder; and
   a vertical address register configured to output the vertical address to the vertical address decoder.

7. The nonvolatile semiconductor memory device according to claim 1, further comprising:
   a bank address register configured to output a bank address; and
   a bank address decoder configured to decode an output signal from the bank address register so as to select one of the plurality of unit bank cell arrays.

8. The nonvolatile semiconductor memory device according to claim 7, wherein the bank address is inputted from a pad which is separated from pads where the column address and the vertical address are inputted.

9. The nonvolatile semiconductor memory device according to claim 1, wherein the vertical address decoding unit comprises:
   a vertical address decoder configured to decode the vertical address to select one of the plurality of cell arrays; and
   a sense amplifier decoding unit configured to selectively connect a bit line of the selected cell array to a column line output from the sense amplifier in response to an output signal from the vertical address decoder.

10. The nonvolatile semiconductor memory device according to claim 9, wherein the sense amplifier decoding unit includes a plurality of switches connected between the column line and the bit line and configured to perform a switching operation in response to an output signal from the vertical address decoder.

11. The nonvolatile semiconductor memory device according to claim 1, wherein the sense amplifier unit includes a plurality of sense amplifiers configured to be activated depending on a decoding result of the column address decoder.

12. The nonvolatile semiconductor memory device according to claim 11, wherein one sense amplifier selected from the plurality of sense amplifiers is connected to one bit line in the selected cell array.

13. The nonvolatile semiconductor memory device according to claim 1, wherein the unit cell includes a FeRAM cell, a PRAM cell, a MRAM cell, or a ReRAM cell.

14. The nonvolatile semiconductor memory device according to claim 1, wherein the plurality of channel regions, the plurality of drain regions, and the plurality of source regions comprise P-type regions.

15. The nonvolatile semiconductor memory device according to claim 1, wherein the plurality of channel regions, the plurality of drain regions, and the plurality of source regions comprise N-type regions.

16. The nonvolatile semiconductor memory device according to claim 1, wherein the floating channel layer comprises a carbon nano-tube.

17. The nonvolatile semiconductor memory device according to claim 1, wherein the floating channel layer comprises silicon.

18. The nonvolatile semiconductor memory device according to claim 1, wherein the floating channel layer comprises germanium.

19. The nonvolatile semiconductor memory device according to claim 1, wherein the floating channel layer comprises an organic semiconductor.

* * * * *